(12) United States Patent
Otsuka

(10) Patent No.: US 7,320,772 B2
(45) Date of Patent: Jan. 22, 2008

(54) SYSTEM FOR EMBOSSING CARRIER TAPE AND METHOD FOR PRODUCING CARRIER TAPE

(75) Inventor: Hiroshi Otsuka, Itami (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 702 days.

(21) Appl. No.: 10/492,693

(22) PCT Filed: Oct. 15, 2002

(86) PCT No.: PCT/JP02/10691

§ 371 (c)(1),
(2), (4) Date: Apr. 15, 2004

(87) PCT Pub. No.: WO03/033353

PCT Pub. Date: Apr. 24, 2003

(65) Prior Publication Data

US 2004/0253333 A1    Dec. 16, 2004

(30) Foreign Application Priority Data

Oct. 17, 2001 (JP) ............................. 2001-319157

(51) Int. Cl.
B29C 51/08 (2006.01)
B29C 51/20 (2006.01)
B29C 59/02 (2006.01)

(52) U.S. Cl. ...................... 264/280; 264/322; 425/112; 425/122; 425/394

(58) Field of Classification Search ..................... None
See application file for complete search history.

(56) References Cited

U.S. PATENT DOCUMENTS

| 3,473,195 | A |   | 10/1969 | Morin |
| 4,009,981 | A | * | 3/1977 | Rosen ......................... 425/388 |
| 4,438,054 | A | * | 3/1984 | Holden ....................... 264/40.6 |
| 4,758,145 | A | * | 7/1988 | Hautemont ................. 425/143 |

FOREIGN PATENT DOCUMENTS

EP    0 521 574    1/1993

(Continued)

OTHER PUBLICATIONS

Notification of Transmittal of Copies of Translation of the International Preliminary Examination Report (Form PCT/IB/338) issued in connection with PCT/JP2002/010691.

(Continued)

Primary Examiner—Edmund H. Lee
(74) Attorney, Agent, or Firm—Smith, Gambrell & Russell, LLP

(57) ABSTRACT

An apparatus for embossing a carrier tape by heating the tape at a heating portion and embossing the tape by heat molding at a molding portion while a long sheet of the tape made of a thermoplastic resin is intermittently transferred by pitch transfer, the apparatus comprising a temperature-maintaining portion having a length approximately corresponding to one pitch disposed between the heating portion and the molding portion; and a process for producing a carrier tape using the apparatus, the process comprising heating the tape at a heating portion, maintaining a temperature of the heated tape at a temperature-maintaining portion and embossing the tape by heat molding at a heat molding portion while a long sheet of the tape is intermittently transferred by pitch transfer. The length of the rib portion connecting embossed portions is decreased by contriving the heating method of the tape.

6 Claims, 4 Drawing Sheets

FOREIGN PATENT DOCUMENTS

| | | | |
|---|---|---|---|
| JP | 1-59616 | | 4/1989 |
| JP | 5-147606 | * | 6/1993 |
| JP | 2000-037774 | | 2/2000 |
| JP | 2001-058606 | | 3/2001 |

OTHER PUBLICATIONS

Translated International Preliminary Examination Report (Form PCT/IPEA/409) issued in connection with PCT/JP2002/010691.

Notice of Reason(s) of Rejection/ Japanese Office Action ; Dec. 18, 2006.

* cited by examiner

PRIOR ART

SYSTEM FOR EMBOSSING CARRIER TAPE AND METHOD FOR PRODUCING CARRIER TAPE

TECHNICAL FIELD

The present invention relates to an apparatus for embossing a carrier tape and a process for producing a carrier tape. More particularly, the present invention relates to an apparatus for embossing a carrier tape and a process for producing a carrier tape which enable a decrease in the length of the rib portion connecting embossed portions for containing electronic parts and an increase in the number of contained electronic parts.

BACKGROUND ART

Mounting of electronic parts at the surface of devices is conducted more widely to rationalize the production and to adapt the production to increases in the type and decreases in the amount. As the form of packaging suited to this mounting, embossed carrier tapes made of a thermoplastic resin are widely used. As shown in FIG. 1, a carrier tape for containing various electronic parts such as semiconductors, parts of high precision instruments and other very small parts has embossed portions 2 as the concave portions for containing the parts which are arranged at the same distance between them in the longitudinal direction in a tape 1 made of a thermoplastic resin, flat rib portions 3 formed between the embossed portions and perforations for transfer of the tape 4 formed at the same distance between them. The tape is used after parts are placed into the concave portion for containing the parts and the tape is sealed with a cover material 5.

The embossed carrier tape is produced by heating the tape at a heating portion and embossing the tape at a molding portion while a long sheet of the tape made of a thermoplastic resin is intermittently transferred by the pitch transfer. Since the number of the part contained in the carrier tape is decided by the pitch of the embossed portions, it is desired that the length in the longitudinal direction of the tape of the rib portion disposed between the embossed portions is decreased so that the number of the contained parts can be increased. Recently, as the size of the electronic parts decrease, the size of the embossed portion decreases and the relative length occupied by the rib portion tends to increase. Since the pitch of the embossed portions is limited to 2 mm, 4 mm, 8 mm or the like by the standard, in some cases, a greater pitch is forced to be used even when the length is changed by about 0.1 mm. The decrease in the length of the rib portion in the longitudinal direction of the tape is very important further due to this situation.

FIG. 2 shows a schematic diagram exhibiting an example of the apparatus for producing a carrier tape. In this apparatus for producing a carrier tape, a long sheet of a tape 6 is supplied from a feed roll 7 and transferred by the pitch transfer using fixing chucks 8 and 9 and transfer chucks 10 and 11, one pitch of the transfer corresponding to the entire length of the mold. The tape is heated at a molding temperature by a pair of heating plates 12 composed of an upper heating plate and a lower heating plate at a heating portion and transferred to the inside of a mold 13 at a molding portion by the pitch transfer. An embossed portion which is the concave portion for containing a part is formed in the tape by heat molding and perforations for transfer of the tape are formed by a punching mold 14 in a punching portion. Finally, the tape is wound by a winding roll 15. For producing a carrier tape having a rib portion having a short length in the longitudinal direction of the tape using the above apparatus, the embossed portions are formed by heat molding under the condition such that the heating portion and the molding portion are disposed as closely as possible to each other. However, it is mechanically limited that the heating portion and the molding portion are disposed very closely to each other and, moreover, there is the possibility that the high temperature at the heating portion affects the molding portion. Therefore, it is impossible that the length of the rib portion is decreased without a limit.

The present invention has an object of providing an apparatus and a process for producing a carrier tape which enables a decrease in the length of the rib portion connecting embossed portions for containing electronic parts and an increase in the number of contained electronic parts.

DISCLOSURE OF THE INVENTION

As the result of the intensive studies by the present inventor to achieve the above object, it was found that the length in the longitudinal direction of the tape of the rib portion which is the portion connecting portions formed by heat molding in successive pitches could be decreased independently of the distance between the heating portion and the molding portion when a temperature-maintaining portion having a length corresponding approximately to one pitch is disposed between the heating portion and the molding portion and that the embossing could be conducted with stability when a heating plate of the heating portion has a length obtained by adding a length of one rib portion to a length corresponding to one pitch so that a portion of the tape having a length obtained by adding a length of one rib portion to a length corresponding to one pitch is heated at the heating portion and the rib portion of the tape which connects portions formed by heat molding in successive pitches is heated twice. The present invention has been completed based on this knowledge.

The present invention provides:

(1) An apparatus for embossing a carrier tape by heating the tape at a heating portion and embossing the tape by heat molding at a molding portion while a long sheet of the tape made of a thermoplastic resin is intermittently transferred by pitch transfer, the apparatus comprising a temperature-maintaining portion having a length approximately corresponding to one pitch disposed between the heating portion and the molding portion:

(2) An apparatus described in (1), wherein a heating plate of the heating portion has a length obtained by adding a length of one rib portion to a length corresponding to one pitch; and (3) A process for producing a carrier tape which comprises heating the tape at a heating portion, maintaining a temperature of the heated tape at a temperature-maintaining portion and embossing the tape by heat molding at a heat molding portion while a long sheet of the tape made of a thermoplastic resin is intermittently transferred by pitch transfer, wherein a heating plate of the heating portion has a length obtained by adding a length of one rib portion to a length corresponding to one pitch, the temperature-maintaining portion has a length obtained by subtracting a length of one rib portion from a length corresponding to one pitch and a portion of the tape having a length obtained by adding a length of one rib portion to a length corresponding to one pitch is heated at the heating portion so that a rib portion of the tape which connects portions formed in successive pitches of heat molding is heated twice, i.e., once by a rear end and once by a front end of the heating plate of the heating portion.

In the Figures, reference number 1 means a tape, 2 means an embossed portion, 3 means a rib portion, 4 means perforations for transfer of the tape, 5 means a cover material, 6 means a tape, 7 means a feed roll, 8 means a fixing chuck, 9 means a fixing chuck, 10 means a transfer chuck, 11 means a transfer chuck, 12 means a heating plate, 13 means a mold, 14 means a punching mold, 15 means a winding roll, 16 means a tape, 17 means an apparatus for vertical movement of a heating plate, 18 means an apparatus for vertical movement of a heating plate, 19 means a heating plate, 20 means a heating plate, 21 means an apparatus for vertical movement of a lower mold, 22 means a lower mold, 23 means a portion for fixing an upper mold, 24 means an apparatus for vertical movement of an upper mold and 25 means an upper mold.

THE MOST PREFERRED EMBODIMENT TO CARRY OUT THE INVENTION

The apparatus for embossing a carrier tape of the present invention is an apparatus for embossing a carrier tape by heating the tape at a heating portion and embossing the tape by heat molding at a molding portion while a long sheet of the tape made of a thermoplastic resin is intermittently transferred by pitch transfer, the apparatus comprising a temperature-maintaining portion having a length approximately corresponding to one pitch disposed between the heating portion and the molding portion. In the apparatus of the present invention, it is preferable that the length of the heating plate of the heating portion has a length obtained by adding a length of one rib portion to a length corresponding to one pitch.

The process for producing a carrier tape of the present invention comprises heating the tape at a heating portion, maintaining a temperature of the heated tape at a temperature-maintaining portion and embossing the tape by heat molding at a heat molding portion while a long sheet of the tape made of a thermoplastic resin is intermittently transferred by pitch transfer, wherein a heating plate of the heating portion has a length obtained by adding a length of one rib portion to a length corresponding to one pitch, the temperature-maintaining portion has a length obtained by subtracting a length of one rib portion from a length corresponding to one pitch and a portion of the tape having a length obtained by adding a length of one rib portion to a length corresponding to one pitch is heated at the heating portion so that a rib portion of the tape which connects portions formed in successive pitches of heat molding is heated twice, i.e., once by a rear end and once by a front end of the heating plate of the heating portion.

Figure 1:
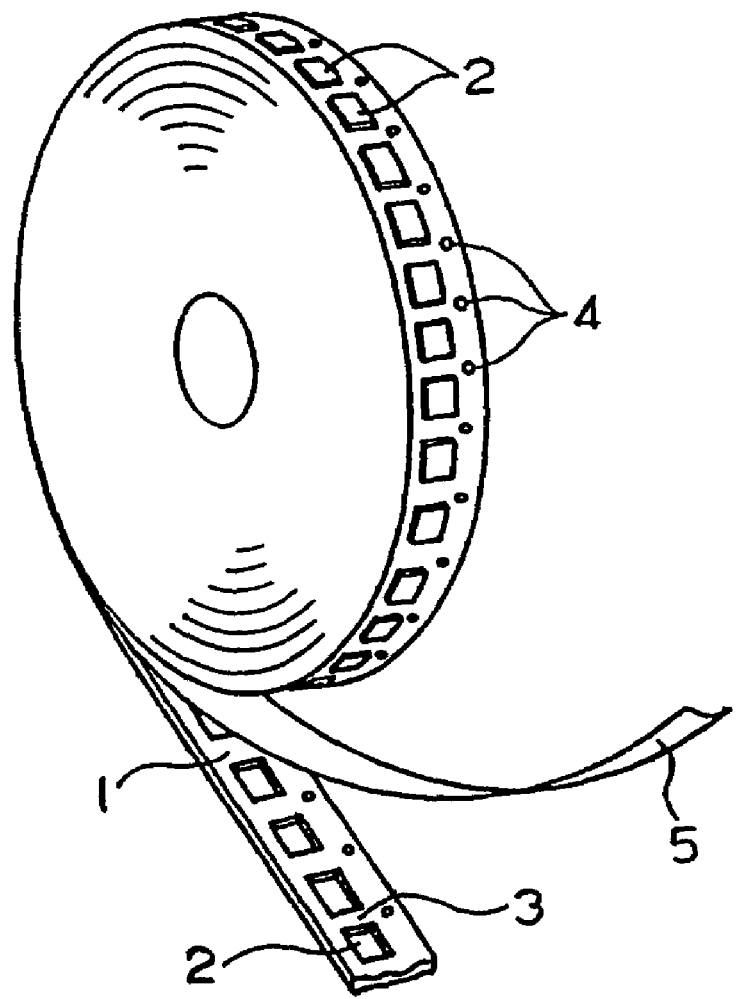
FIG. 1 shows a perspective view of an example of a carrier tape.
Figure 2:
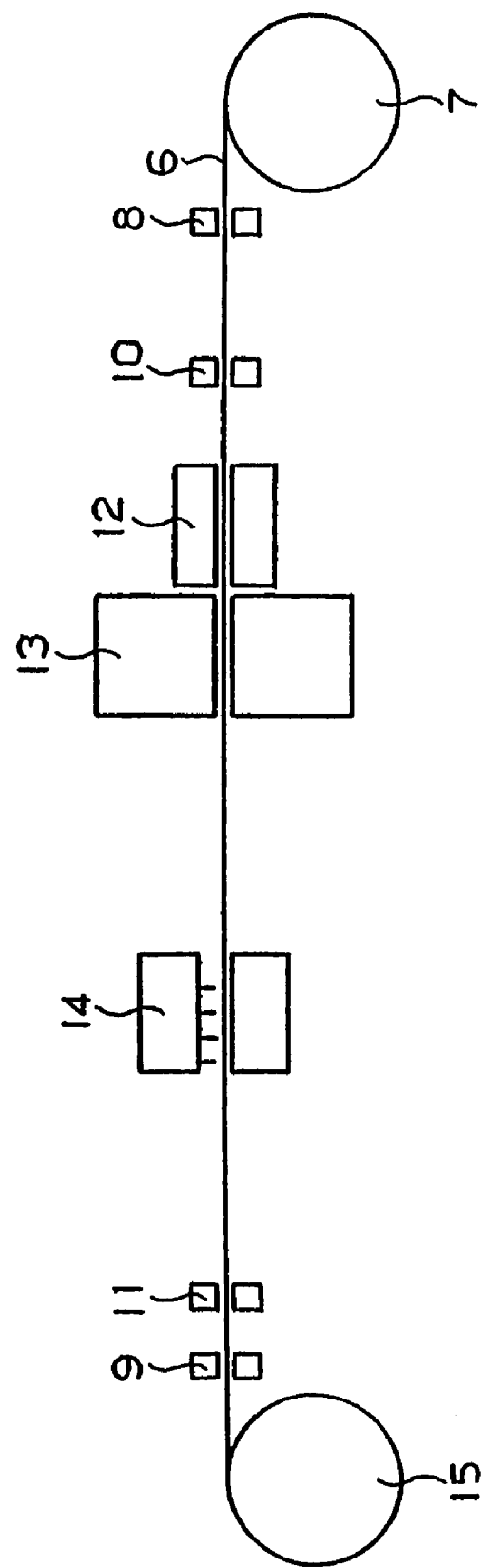
FIG. 2 shows a schematic diagram exhibiting an example of the apparatus for producing a carrier tape.
Figure 3:
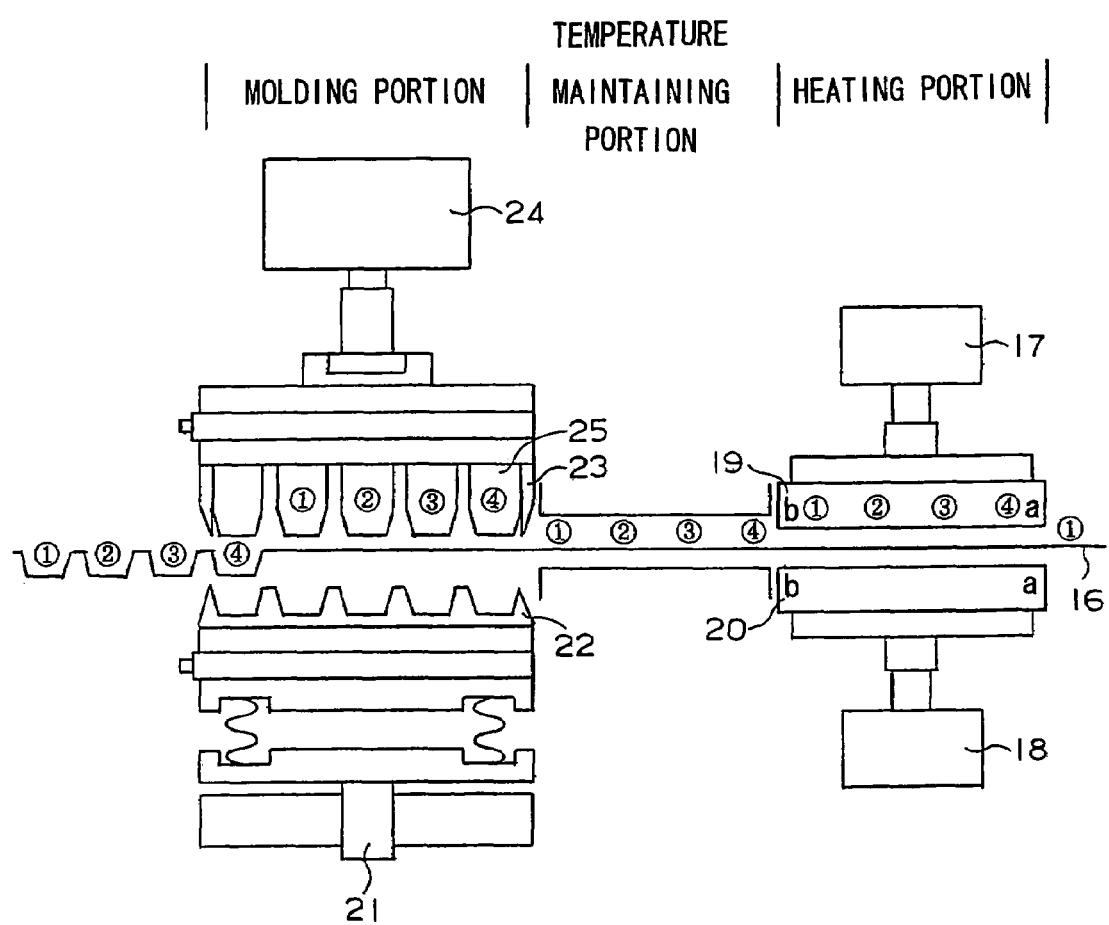
FIG. 3 shows a diagram exhibiting a heating portion, a temperature-maintaining portion and a molding portion of an embodiment of the apparatus of the present invention.

FIG. 3 shows a diagram exhibiting a heating portion, a temperature-maintaining portion and a molding portion of an embodiment of the apparatus of the present invention. In the apparatus of the present invention, four embossed portions are formed in a single operation of embossing. In FIG. 3, ①, ②, ③ and ④ show the positions where the embossing is to be conducted or has been conducted. In a single operation of embossing, the embossed portions are formed at one set of positions ① to ④. The tape 16 supplied to the heating portion by the pitch transfer is held between heating plates 19 and 20 by the working of apparatuses for vertical movement of a heating plate 17 and 18 and heated. When the tape is heated for a prescribed time and the temperature of the tape reaches a prescribed value, the apparatuses for vertical movement of a heating plate are moved and the heating plates are separated from each other. The heated tape is transferred to a temperature-maintaining portion by the pitch transfer. When it is considered that the tape is slightly cooled in the temperature-maintaining portion, the temperature of heating the tape can be set at a slightly higher value than the value set in an apparatus in which the heating portion and the molding portion are adjacent to each other.

The tape transferred to the temperature-maintaining portion is retained in this portion for a period of time corresponding to one pitch in the operation of the apparatus for embossing. The structure of the temperature-maintaining portion is not particularly limited. For example, the tape may be shielded from the outside atmosphere with a material having a small thermal conductivity so that the temperature of the heated tape is not decreased to a value lower than the temperature suitable for the heat molding. In another example, heated air may be blown into the temperature-maintaining portion which is shielded from the outside atmosphere. In still another example, an infrared lamp or the like may be used to mildly heat the tape. Due to the temperature-maintaining portion disposed between the heating portion and the molding portion, the mechanical and thermal restriction on the distance between the heating portion and the molding portion can be eliminated and the embossing can be conducted under the condition that the length of the rib portion between the portions ④ and ① is decreased.

The tape held at the elevated temperature at the temperature-maintaining portion is then transferred to the molding portion by the next pitch transfer and embossed. In the molding portion, the heated tape is held between a lower mold 22 moved upwards by the working of an apparatus for vertical movement of a lower mold 21 and a portion for fixing an upper mold 23. Immediately thereafter, an upper mold 25 is moved downwards by the working of an apparatus for vertical movement of an upper mold 24. The tape is embossed by the upper mold and the lower mold. In the molding portion of the present embodiment, the upper mold and the lower mold have five male molds and five female molds, respectively. Since the embossed portion which has been formed at the position ④ in the previous pitch is held by the male mold and the female mold at the left end, the embossing at the positions ① to ④ can be conducted at the accurate positions.

Figure 4:
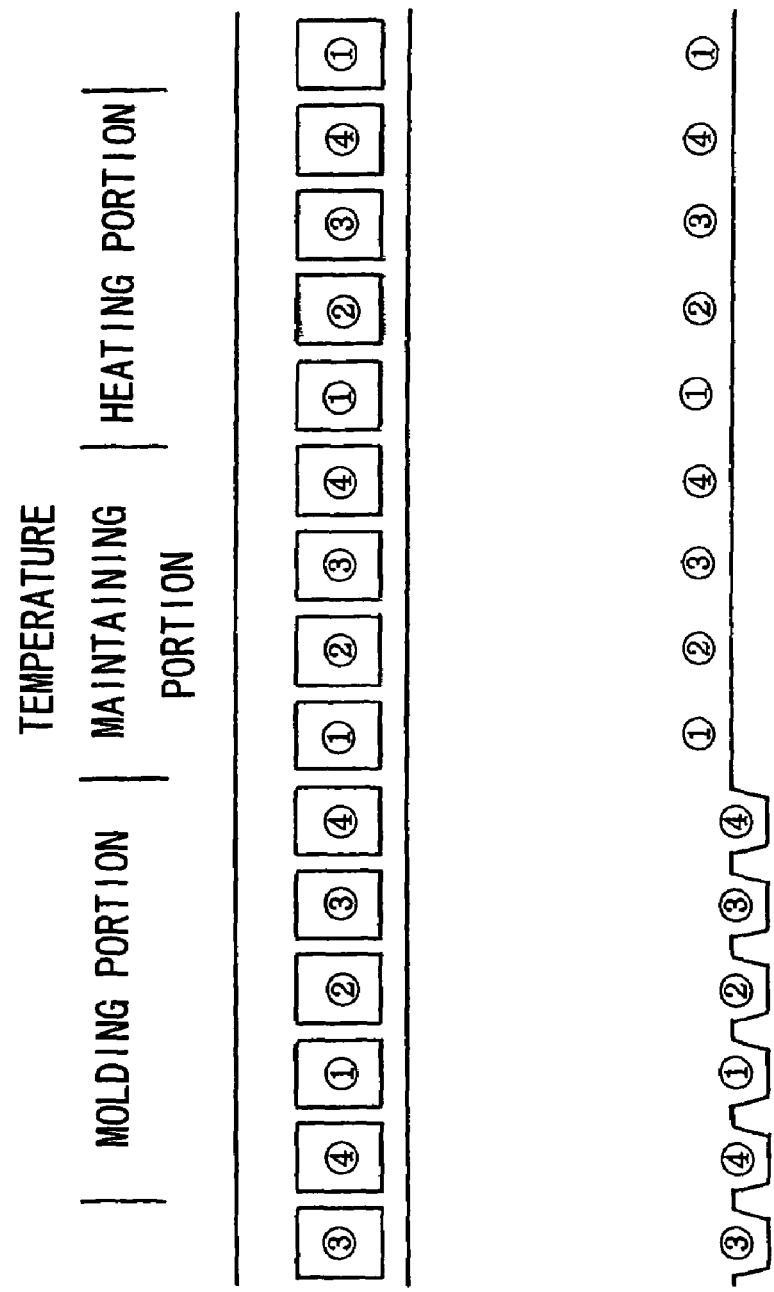
FIG. 4 shows a diagram describing an embodiment of the process for producing a carrier tape of the present invention.

FIG. 4 shows a diagram describing an embodiment of the process for producing a carrier tape of the present invention. In FIG. 4, ①, ②, ③ and ④ show the positions where the embossing is to be conducted or has been conducted. In a single operation of embossing, the embossed portions are formed at a set of positions shown by ①, ②, ③ and ④. In the embodiment of the apparatus for embossing shown in FIG. 3, the heating plate of the heating portion has a length obtained by adding a length of one rib portion to a length corresponding to one pitch. When the tape is transferred to the heating portion by the pitch transfer, the rib portion between the position ④ and the position ① at the rear of the tape is heated at a portion a of the heating plate since the heating plate of the heating portion has a length obtained by adding a length of one rib portion to a length corresponding to one pitch. When the tape is transferred forwards by one pitch by the pitch transfer, the rib portion between the position ④ and the position ① heated above by the portion a of the heating plate is transferred forwards and heated again by a portion b of the heating plate. In other words, the rib portion connecting the portions formed by heat molding in successive pitches is heated twice, i.e., once by the rear end and once by the front end of the heating plate of the heating portion. Therefore, forming a rib portion having a short length in the longitudinal direction of the tape is made possible although the rib portion is used for connecting the portions formed in successive pitches.

In the molding portion of the apparatus for embossing, as shown in FIG. 3, it is preferable that portions for holding the tape at the inlet and the outlet of the lower mold 22 and the portion for fixing an upper mold 23 have a thickness decreasing towards the tips so that cooling of the heated tape is prevented. When cooling of the heated tape is prevented by the portions for holding the tape having the thickness decreasing towards the tips, the rib portion having a short length in the longitudinal direction of the tape can be accurately formed although the rib portion is used for connecting the portions formed in successive pitches. The dimensions of the rib portions between ① and ②, ② and ③ and ③ and ④ are decided by the dimensions of the mold. The excellent accuracy of the dimension of the rib portion between ④ and ① which connects the portions formed in successive pitches can be achieved by providing a sufficient accuracy to the transfer of the tape and by heating the rib portion twice as described above.

INDUSTRIAL APPLICABILITY

To summarize the advantages of the present invention, using the apparatus for embossing a carrier tape and in accordance with the process for producing a carrier tape of the present invention, a carrier tape having a rib portion having a short length in the longitudinal direction of the tape can be produced by a conventional flat-type press molding machine and the number of parts contained in the carrier tape can be increased.

The invention claimed is:

1. An apparatus for embossing a carrier tape, comprising:
   a heating portion for heating a tape to a desired temperature,
   a temperature-maintaining portion adapted to shield the heated tape from the outside environment and to maintain the heated tape at the desired temperature, and
   a molding portion for embossing the heated tape by heat molding,
   wherein the temperature-maintaining portion is disposed between the heating portion and the molding portion and has a length approximately corresponding to one pitch, and
   wherein the heating portion comprises a heating plate having a length obtained by adding a length of one rib portion to a length corresponding to one pitch.

2. An apparatus according to claim 1, wherein the temperature-maintaining portion comprises a material having a thermal conductivity such that the temperature of the heated tape shielded by the temperature-maintaining portion is not decreased to a value lower than a temperature suitable for heat molding.

3. A process for producing a carrier tape comprising:
   (A) providing an apparatus for embossing a carrier tape, comprising a heating portion for heating a tape to a desired temperature, a temperature-maintaining portion adapted to shield the heated tape from the outside environment and to maintain the heated tape at the desired temperature, and a molding portion for embossing the heated tape by heat molding, wherein the temperature-maintaining portion is disposed between the heating portion and the molding portion and has a length approximately corresponding to one pitch, further wherein the heating portion comprises a heating plate having a length obtained by adding a length of one rib portion to a length corresponding to one pitch; and
   (B) intermittently transferring a sheet of tape through the apparatus by pitch transfer, wherein during such intermittent transfer of said sheet of tape:
      (i) the sheet of tape is moved first to the heating portion of the apparatus where the sheet is heated to a desired temperature;
      (ii) the heated sheet of tape is then moved to the temperature-maintaining portion of the apparatus and maintained at the desired temperature; and
      (iii) the heated sheet of tape is then moved from the temperature-maintaining portion to the molding portion of the apparatus and embossed by heat molding;
   wherein during the heating of the sheet of tape at the heating portion of the apparatus, a portion of the sheet having a length obtained by adding a length of one rib portion to a length corresponding to one pitch is heated so that a rib portion of the tape which connects portions formed in successive pitches of heat molding is heated once by a rear end of the heating portion of the apparatus and once by a front end of the heating portion, whereby said rib portion of the tape is heated twice.

4. A process according to claim 3, wherein the tape comprises a thermoplastic resin.

5. A process according to claim 3, wherein in the apparatus provided in step (A), the temperature-maintaining portion has a length obtained by subtracting a length of one rib portion from a length corresponding to one pitch.

6. A process according to claim 3, wherein in the apparatus provided in step (A), the temperature-maintaining portion comprises a material having a thermal conductivity such that the temperature of the heated tape shielded by the temperature-maintaining portion is not decreased to a value lower than a temperature suitable for heat molding.

* * * * *